United States Patent [19]

Yamada et al.

[11] Patent Number: 4,549,099
[45] Date of Patent: Oct. 22, 1985

[54] PERIODIC SIGNAL DETECTING CIRCUIT INCLUDING COMPARATOR CIRCUIT WITH VARIABLE THRESHOLD AND VARYING TIME CONSTANT

[75] Inventors: Takashi Yamada, Anjo; Mamoru Shimamoto, Nagoya, both of Japan

[73] Assignee: Nippondenso Company, Ltd., Kariya, Japan

[21] Appl. No.: 487,761

[22] Filed: Apr. 22, 1983

[30] Foreign Application Priority Data

Apr. 28, 1982 [JP] Japan .................................. 57-71975

[51] Int. Cl.[4] ........................................... H03K 5/153
[52] U.S. Cl. ..................... 307/359; 307/261; 307/356; 307/494; 307/503; 307/551; 328/149; 328/151
[58] Field of Search ............... 123/414, 602, 605, 612, 123/618; 307/494, 503, 354, 356, 358–359, 551, 561, 261, 269; 328/28, 151, 146–147, 149; 330/103, 260, 294

[56] References Cited

U.S. PATENT DOCUMENTS

| | | | |
|---|---|---|---|
| 3,939,365 | 2/1976 | Lindgren | 328/146 X |
| 3,999,083 | 12/1976 | Bumgardner | 307/358 |
| 4,153,850 | 5/1979 | Boyer | 307/354 |
| 4,169,996 | 10/1979 | Cavigelli | 330/103 X |
| 4,202,304 | 5/1980 | Jundt et al. | 123/618 |
| 4,306,191 | 12/1981 | Bader | 307/494 X |
| 4,406,988 | 9/1983 | Scholz | 307/354 X |
| 4,481,675 | 11/1984 | Ichikawa et al. | 307/358 X |

Primary Examiner—Stanley D. Miller
Assistant Examiner—D. R. Hudspeth
Attorney, Agent, or Firm—Cushman, Darby & Cushman

[57] ABSTRACT

A periodic signal detecting circuit including a comparator compares a threshold voltage varying with a time constant and an engine speed signal from an electromagnetic pickup coil so as to generate an output. The time constant is varied in accordance with the switching operation of a diode switch which is turned on and off in accordance with the comparator output. When the switch is in off condition, the threshold voltage is varied with the time constant which is changed successively.

5 Claims, 15 Drawing Figures

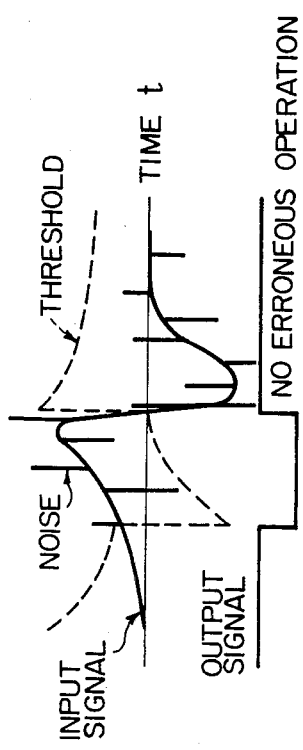
FIG. 2a
PRIOR ART
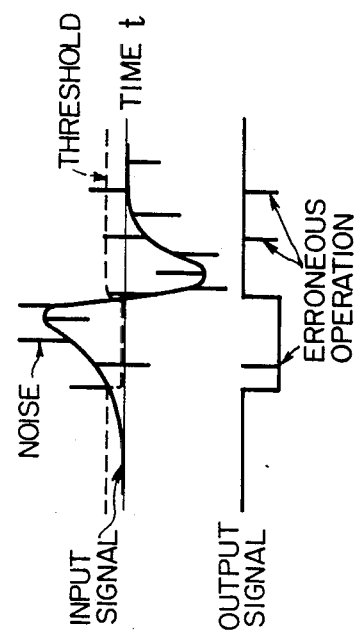
FIG. 2b
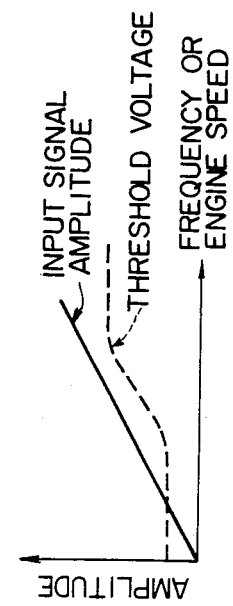
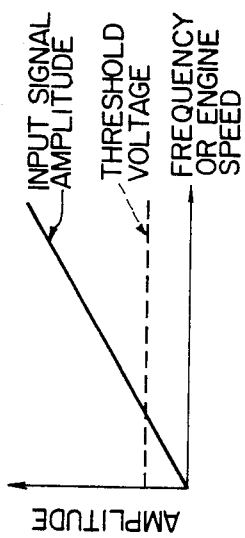

PERIODIC SIGNAL DETECTING CIRCUIT INCLUDING COMPARATOR CIRCUIT WITH VARIABLE THRESHOLD AND VARYING TIME CONSTANT

BACKGROUND OF THE INVENTION

The present invention relates to periodic signal detecting circuits and more particularly to a circuit employing a comparator circuit for comparing an input periodic signal waveform with a predetermined threshold voltage and generating an output signal, e.g., a circuit for reshaping the waveform of a periodic signal such as a signal from a rotational position detecting electromagnetic pickup coil and generating an output signal or a circuit for detecting the rotation of a crankshaft of an internal combustion engine.

The known circuits of the above type are constructed so that, as shown in FIG. 1, a threshold voltage is generated by a feedback resistor or CR time constant circuit connected between a comparator output terminal and a comparison input terminal and a grounded terminal and the threshold voltage is compared with an input signal waveform from an electromagnetic pickup coil thereby generating an output signal. Where the feedback resistor is simply connected, there is a disadvantage that the circuit tends to detect the noise superposed on an input waveform due to the threshold voltage being constant. Also the circuit in which the CR time constant circuit is connected is disadvantageous in that if the time constant is large and the output signal changes its state in response to the positive-going portion of the input signal, the output signal is not necessarily reset in response to the zero crossing of the negative-going portion of the input signal and the detection of rotational positions becomes inaccurate. If the time constant is small, while the circuit does not detect noise just after the change of state of the output signal, it tends to detect noise after a period determined by the time constant CR. Also, in order to prevent any erroneous operation due to noise superposed on an input waveform and in order to vary the triggering level in response to the input signal frequency so as to prevent any variation of the triggering point angular position (e.g., variation of the crankshaft position in the case of an internal combustion engine ignition system) due to variation of the input signal frequency, a circuit construction has been proposed in which a plurality of time constant circuits are included to provide different threshold voltages (varying in the same polarity with the input signal waveform) and the threshold voltages are selectively coupled to a comparator circuit. This construction has the disadvantage of being complicated in circuit construction.

SUMMARY OF THE INVENTION

Thus the present invention has been made to overcome the foregoing deficiencies of the prior art apparatus by a circuit which is simple in construction but improved on the prior art circuits such as shown in FIG. 1.

It is, therefore, the primary object of the present invention to provide a periodic signal detecting circuit including a comparator circuit for comparing an input signal waveform and a threshold voltage having a time constant varying with the input signal frequency and generating an output signal, a time constant circuit, and means which is turned on and off in response to the comparator circuit output signal to control the connection between the time constant circuit and time constant varying means and thereby vary the time constant in accordance with the comparator circuit output signal.

Thus, although simple in construction, the periodic signal detecting circuit of this invention has the advantage of preventing any erroneous operation due to noise and providing the threshold voltage with the desired frequency characteristic and thereby ensuring accurate signal detection.

BRIEF DESCRIPTION OF THE DRAWINGS

FIG. 2a shows the relationship between the erroneous operation due to noise and the input signal, output signal and threshold voltage characteristic of the first circuit in FIG. 1.

FIGS. 2b and 2c show the relationship between the erroneous operation due to noise and the input signal, output signal and threshold voltage characteristic of a periodic signal detecting circuit of this invention, with FIG. 2b showing the case of the input signal having a pulse waveform varying like a letter S and FIG. 2c showing the case of the input signal having a sawtooth pulse waveform.

DESCRIPTION OF THE PREFERRED EMBODIMENTS

Figure 1A:
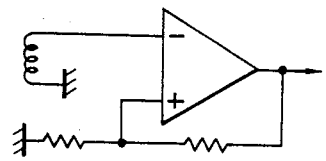
FIGS. 1a and 1b show two examples of a prior art periodic pulse detecting circuit.
Figure 1B:
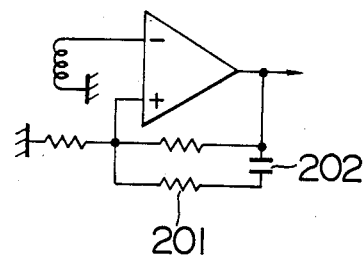
Figure 2C:
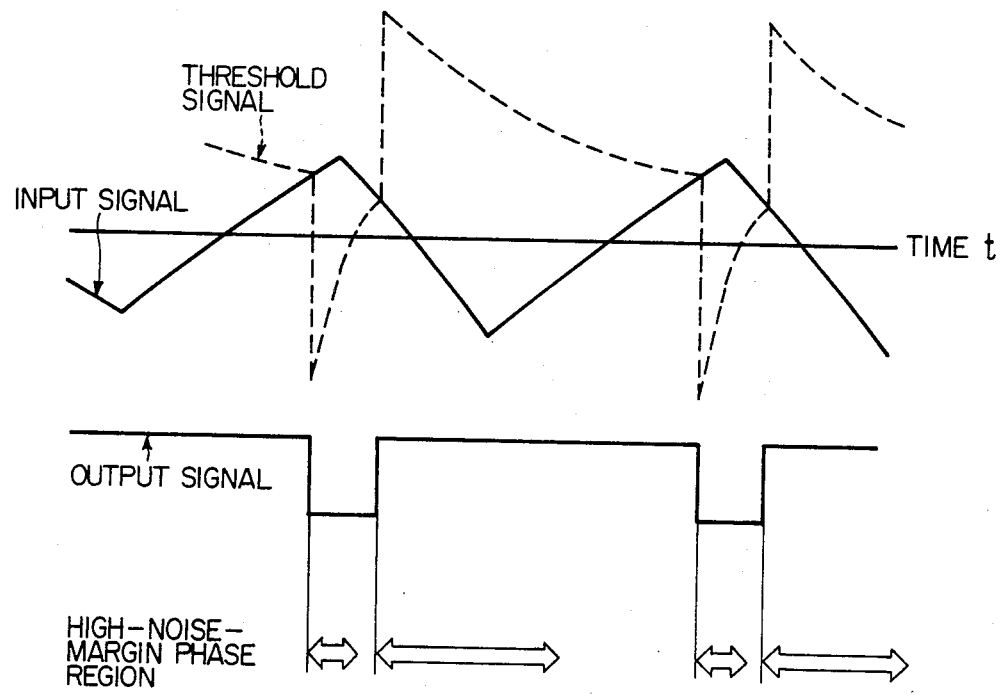

FIGS. 1a and 1b show the previously mentioned examples of the prior art circuit, and FIGS. 2a to 2c show exemplary characteristics of the circuits shown in FIGS. 1a and 1b and a periodic signal detecting circuit of this invention for their comparative explanation. In the case of the prior art circuit of FIG. 2a, the threshold voltage is reduced to the zero level after the output signal has changed its state in response to the positive-going portion of the input signal exceeding the threshold voltage. In the case of the present invention shown in FIGS. 2b and 2c, when the positive-going portion of the input signal waveform generated from an electromagnetic pickup coil exceeds the threshold voltage so that the output signal changes its state, the threshold voltage varying time constant is changed to a different value the threshold voltage is changed to a voltage of the opposite polarity to the positive-going polarity of the input signal thereby increasing the noise margin for the succeeding input signal waveform and reducing the occurrence of erroneous operation. Even if the input signal of FIG. 2c is a sawtooth waveform, a high degree of noise margin can be ensured for the input signal over a certain phase angle. In these cases, a threshold voltage for detecting the positive-going portion of an input signal is generated in proportion to the input signal frequency and a threshold voltage for detecting the negative-going portion of the input signal is decreased with a relatively fast time constant thereby making possible the detection of zero crossings as desired.

Figure 3:
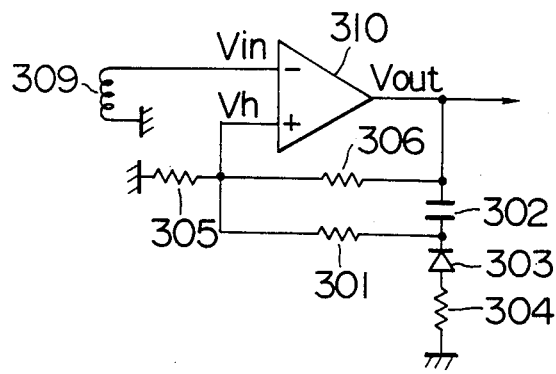
FIG. 3 shows a first embodiment of the circuit according to the invention.
Figure 4:
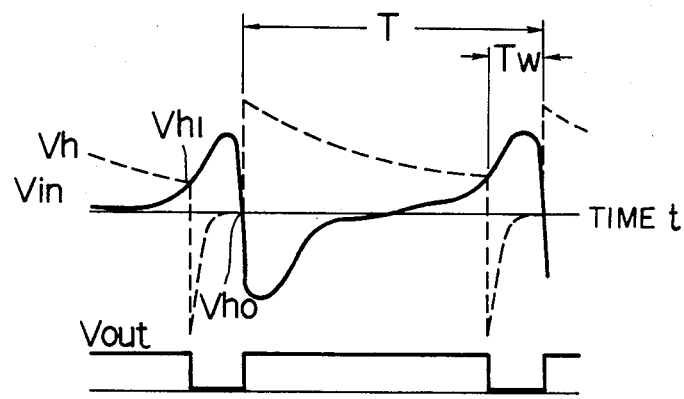
FIGS. 4 to 6 show a plurality of waveforms for explaining the operation of the circuit shown in FIG. 3.
Figure 5:
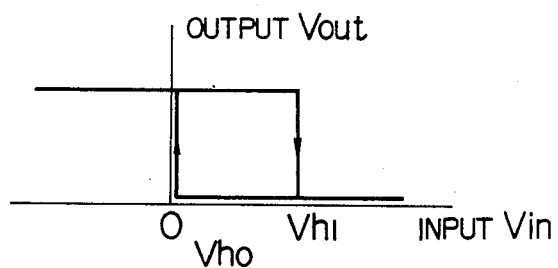

FIG. 3 shows the principal connection arrangement of a first embodiment of the invention. The connection of the power supply, etc., by the conventional techniques are not shown. (A similar omission is involved in the succeeding embodiments.) A comparator circuit 310 (hereinafter referred to as a comparator) receives at its negative input terminal and positive input terminal an input voltage Vin (input signal applied from an electromagnetic pickup coil 309) and a threshold voltage Vh (hysteresis voltage). FIG. 4 shows exemplary waveforms of these voltages and an output voltage Vout. Also the relationship between the input voltage Vin and the output voltage Vout is shown in FIG. 5. When the output voltage Vout goes to a high level, a diode 303 is not turned on and thus the hysteresis voltage Vh is the sum of a voltage determined by resistors 305 and 306 and a voltage determined by a resistor 301 and a capacitor 302. The time constant of the resistor 301 and the capacitor 302 is selected to be on the order of the period T of the input signal and thus the hysteresis voltage Vh decreases gradually and crosses the input voltage Vin at $Vh_1$ as shown in FIG. 4. When this occurs, the output voltage Vout goes to a low level. When the period T of an input signal decreases or the input signal frequency increases, the value of $Vh_1$ is increased. In other words, the hysteresis voltage increases with increase in the frequency of an input signal. The hysteresis voltage increases approximately in proportion to the frequency of an input signal over a certain range of frequencies.

Figure 6:
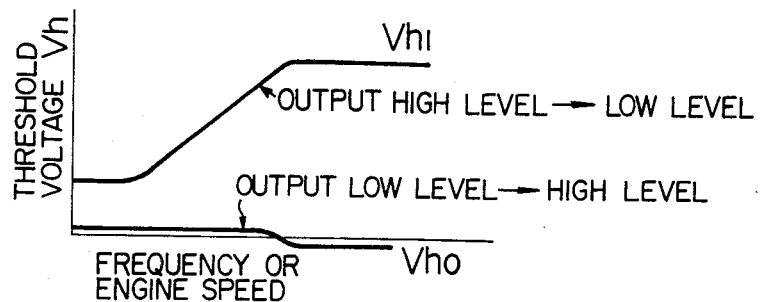

When the output voltage Vout goes to the low level, the diode 303 is turned on and the charge on the capacitor 302 is discharged quickly. At this time, the rate of discharge is determined mainly by a resistor 304. This time constant is selected to be on the order of a duration time Tw of the positive peak of an input signal. As a result, the hysteresis voltage Vh decreases practically to zero voltage by the time that the input voltage approaches the zero crossing. When the input voltage Vin becomes equal to the hysteresis voltage Vh at $Vh_o$, the output voltage Vout goes to the high level. FIG. 6 shows the frequency characteristic of the threshold voltage in the present embodiment. In the Figure, the abscissa represents the input signal frequency.

Figure 7:
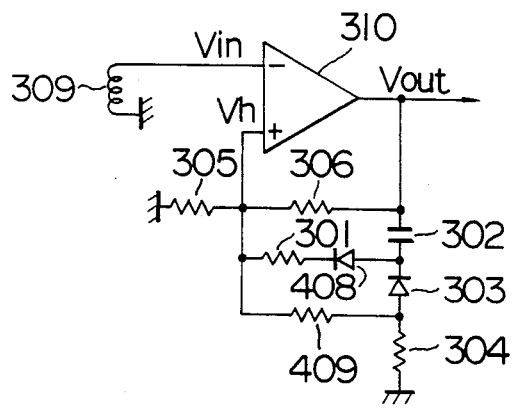
FIGS. 7 to 9 show respectively second to fourth embodiments of the circuit according to the invention.

In the above-described embodiment, when the value of $Vh_o$ becomes less than several hundred mV, the forward voltage drop in the diode 303 makes a quick discharge impossible. As a result, it is impossible to effect the accurate detection of zero crossings. FIG. 7 is a circuit diagram showing a second embodiment of the invention capable of detecting zero crossings with a greater accuracy. The circuit of FIG. 7 differs from the circuit of FIG. 3 in that a diode 408 and a resistor 409 are additionally connected. When the output voltage Vout goes to the high level, the diode 408 is turned on and the diode 303 is not turned on. As a result, the hysteresis voltage Vh decreases substantially with a time constant determined by the resistor 301 and the capacitor 302, which is on the order of the period T of the input signal applied from the electromagnetic pickup coil 309. Accordingly the compared voltage level $Vh_1$ rises with increase in the frequency of the input signal.

When the output voltage Vout goes to the low level, the diode 408 is not turned on and the diode 303 is turned on thereby quickly discharging the capacitor 302, mainly through the resistor 304. This time constant is selected to be on the order of the duration time Tw of the positive peak of the input signal. The voltage appearing across the resistor 304 is added to the hysteresis voltage Vh through the resistor 409. If there is a forward voltage drop in the diode 303, upon completion of the discharge the voltage across the resistor 304 decreases practically to zero voltage and thus the hysteresis voltage Vh becomes practically equal to zero voltage after the duration time Tw following the transition of the output to the low level. Thus, there results the hysteresis voltage $Vh_o \approx 0$ and the accurate detection of a zero crossing is ensured.

Figure 8:
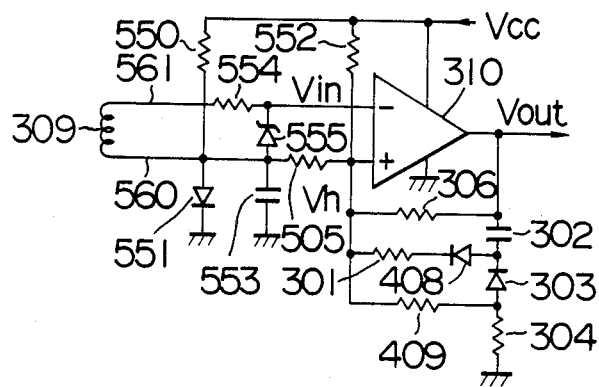

If some types of commercially available comparators are used with a single positive polarity power supply, there is the possibility that an erroneous operation will be caused when the input signal becomes negative. FIG. 8 is a circuit diagram showing a third embodiment of the invention designed to prevent the occurrence of any erroneous operation due to the use of a comparator of the above type. This embodiment principally differs from the circuit of FIG. 7 in that resistors 505, 550, 552 and 554, a diode 551, a capacitor 553 and a Zener diode 555 are added and connected as shown in the Figure. Signal lines 560 and 561 connect an electromagnetic pickup coil 309 to the input terminals of the comparator 310 through the resistors 505 and 554, respectively. The resistor 550 supplies a forward bias current from a single power supply Vcc to the diode 551 and thus a voltage of about 0.6 V is produced across the diode 551. This voltage is applied as an offset to the negative input terminal and the positive input terminal of the comparator 310. On the other hand, the input signal is clamped by the resistor 554 and the Zener diode 555 to come within the range of from about +4 V to about −0.6 V. As a result, the input signal Vin will never become a negative voltage.

The capacitor 553 is provided to reduce the high frequency ac impedance on the signal lines so that if the signal lines 560 and 561 are long, the signal lines 560 and 561 are prevented from picking up noise. Also, the resistor 552 applies a predetermined offset voltage of about 0.6 V to the hysteresis voltage Vh and thereby detect zero crossings of the voltage considered on the basis of the signal line 560 and hence the signal voltage from the electromagnetic pickup coil 309.

The following are typical examples of the constants:
Resistor 301: 5.6 kΩ
Resistor 304: 560Ω
Resistor 306: 82 kΩ
Capacitor 302: 10 μF
Diodes 303; 408; 551: IS 1588 (TOSHIBA)
Comparator 310: μPC 177/339 (NEC)
Resistor 409: 6.8 kΩ
Resistor 505: 1 kΩ
Resistor 550: 3.3 kΩ
Resistor 552: 47 kΩ
Resistor 554: 6.2 kΩ
Zener diode 555: RD 4.7 EB (NEC)
Signal frequency range: 4–40 Hz.

Figure 10:
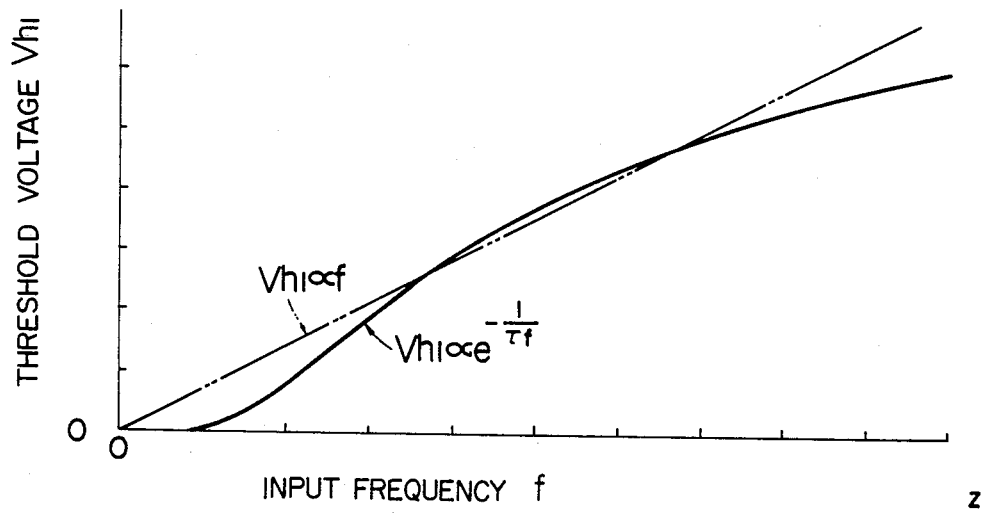
FIG. 10 shows a comparison between an ideal threshold voltage characteristic proportional to the input frequency and the threshold voltage frequency characteristic of the embodiments of this invention.

In the embodiments shown in FIGS. 3, 7 and 8, the threshold voltage $Vh_1$ for changing the comparator output from the high level to the low level is made approximately proportional to the input frequency as shown in FIG. 6 and the degree of approximation is as shown in FIG. 10. FIG. 10 shows a comparison between an ideal threshold voltage characteristic (the characteristic indicated by the two-dot chain line proportional to the input frequency) and a threshold voltage frequency characteristic (the characteristic indicated by the solid line) such as obtained by the embodiments of FIGS. 3, 7 and 8, and the characteristics of these embodiments cannot be made proportional to the input frequency over a wide range of frequencies.

In the embodiments shown in FIGS. 3, 7 and 8, a voltage $ke^{-(t/\tau)}$ (k is a constant) which decreases with a time constant $\tau$ determined by a resistor and a capacitor is applied as a threshold voltage $Vh_1$. This results in the characteristic shown in FIG. 10.

Figure 9:
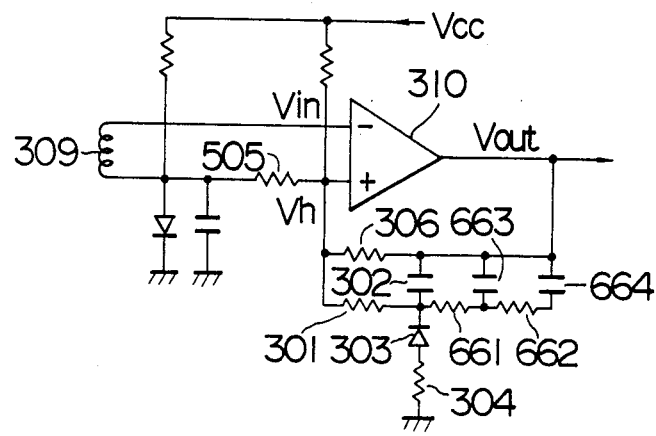

FIG. 9 is a circuit diagram showing a fourth embodiment designed so that the threshold voltage $Vh_1$ for changing the comparator output from the high level to the low level is varied with a greater approximation in proportion to the input signal frequency over a wider range of input signal frequencies. In this embodiment, a plurality of time constant circuits are included so that a plurality of voltages $k_1e^{-(t/\tau 1)}$, $k_2e^{-(t/\tau 2)}$ ..., $k_n e^{-(t/\tau n)}$ having different time constants and amplitudes are generated and combined to produce $Vh = k_1e^{-(t/\tau 1)} + k_2e^{-(t/\tau 2)} \ldots + k_n e^{-(t/\tau n)}$ and obtain the value of $Vh_1$ with respect to the elapsed time t (from the time that the comparator output changes to the high level) approximately as $Vh_1 167$ k/t and thereby add the threshold voltage $Vh_1$ ($n \approx 2$). If the input frequency is represented by f, when $t \approx 1/f$, the threshold voltage $Vh_1$ becomes kf and it is proportional to the input frequency.

The different time constants $\tau_1$, $\tau_2$ and $\tau_3$ are mainly determined by the resistor 301 and the capacitor 302, a resistor 661 and a capacitor 663, and a resistor 662 and a capacitor 664, respectively, and the different amplitudes $k_1$, $k_2$ and $k_3$ are mainly determined by the resistor 505/(the resistor 301), the resistor 505/(the resistor 301+resistor 661), and the resistor 505/(the resistor 301+resistor 661+resistor 662), respectively.

Also, the fourth embodiment of FIG. 9 may be modified in such a manner that the threshold voltage $Vh_1$ becomes a function of the input frequency f other than the proportional relation. This can be attained by simply reestablishing the previously mentioned amplitudes $k_1$, $k_2$, ... $k_n$.

Figure 11:
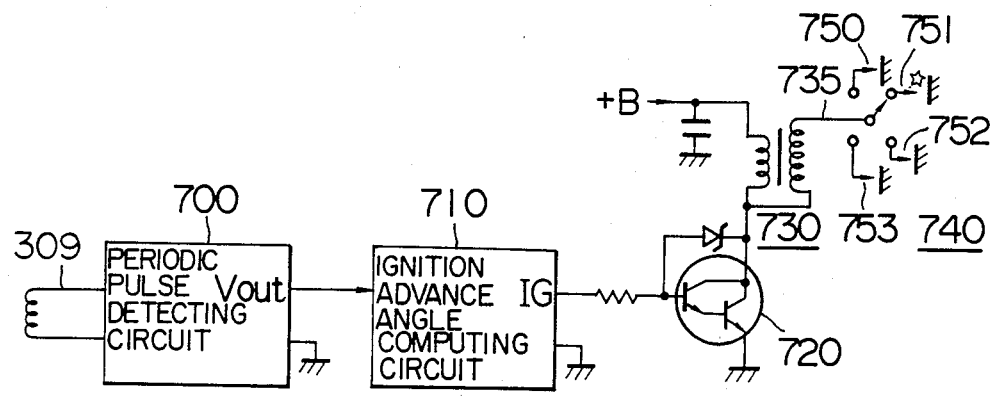
FIG. 11 shows a fifth embodiment of the invention which is applied to an internal combustion engine ignition system.

FIG. 11 shows a fifth embodiment of the invention which is applied to an ignition system.

Numeral 700 designates a periodic pulse detecting circuit according to the invention which receives a signal from a crankshaft position detecting electromagnetic pickup coil 309 and generates an output signal Vout as a crankshaft position signal. Numeral 710 designates an ignition advance angle computing circuit including for example a microprocessor which receives the output signal Vout of the periodic pulse detecting circuit 700 to generate an ignition pulse signal IG. Numeral 720 designates a Darlington power transistor responsive to the output signal IG of the ignition advance angle computing circuit 710 to switch on and off the current flowing to an ignition coil 730. A secondary winding side output 735 of the ignition coil 730 is connected to the center electrode of a distributor 740. Numerals 750 to 753 and 754 designate spark plugs connected to the distribution electrodes of the distributor 740. As a result, the secondary winding output 735 of the ignition coil 730 is applied to one of the spark plugs selected by the distributor 740 to produce an ignition spark thereat.

Figure 12:
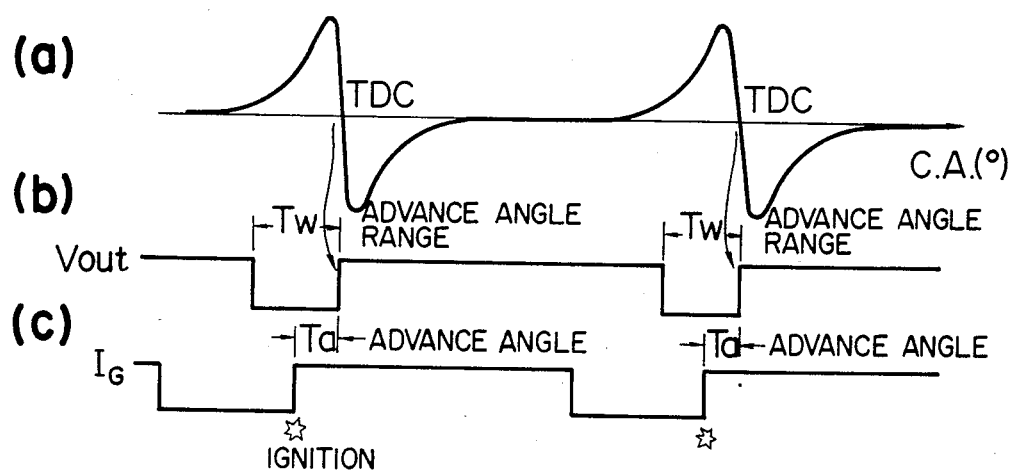
FIG. 12 shows a plurality of waveforms for explaining the operation of the system shown in FIG. 11.

FIG. 12 is a waveform diagram for explaining the operation of the fifth embodiment. The abscissa represents the engine crank angle in graduated form. Shown in (a) is the output signal of the electromagnetic pickup coil 309 and shown in (b) is the output signal Vout of the periodic pulse detecting circuit 700 according to the present invention.

The dwell angle Tw of the output signal Vout can be provided with either one of the following characteristics in accordance with the previously described first, second, third and fourth embodiments.

| | Characteristic | Ground |
|---|---|---|
| (1) | The dwell angle $T_W$ of substantially a constant value | The input signal from the electromagnetic pickup coil has an amplitude proportional to its frequency and the threshold voltage can also be made to be proportional to the frequency. |
| (2) | The dwell angle $T_W$ of a certain frequency characteristic | The input signal from the electromagnetic pickup coil has an amplituide proportional to the input frequency and the threshold voltage can be provided with a certain frequency characteristic. |

The dwell angle $T_W$ of the output signal $V_{out}$ provides a possible ignition timing advance range which will be described later and thus (1) the ignition timing advance range can be maintained substantially constant or (2) it can be controlled at an angle determined in accordance with the engine speed.

The ignition advance angle computing circuit 710 receives the output signal $V_{out}$ of the periodic pulse detecting circuit 700 and generates the ignition pulse signal shown in (c) of FIG. 12. The low level of the ignition pulse signal IG indicates the energization of the ignition coil 730 and its leading edge indicates the interruption of current flow to the ignition coil 730 or the ignition timing.

The ignition advance computing circuit 710 is programmed to effect the ignition at an ignition advance angle Ta corresponding to the engine operating condition. To accomplish it, the ignition advance angle computing circuit 710 measures the pulse width $T_W$ of the output signal $V_{out}$ of the periodic pulse detecting circuit 700 of one period before, computes the value of $T_W - T_a$, waits for the time of $T_W - T_a$ in response to the transition to the low level of the output signal $V_{out}$ from the periodic pulse detecting circuit 700 and then turns off the transistor 720 and effects the ignition in response to the lapse of the time $T_W - T_a$. If, in this case, the engine is accelerating and the current pulse width $T_W$ is shorter than the pulse width $T_W$ of one period before thereby causing the output signal $V_{out}$ to go to the high level during the waiting time $T_w - T_a$, the ignition is effected immediately. In other words, the ignition advance angle $T_a$ is limited to $T_a \geq 0$.

In this case, the advance angle $T_a$ enables the ignition within the pulse width $T_W$ of the output signal $V_{out}$ from the periodic pulse detecting circuit 700. The reason is that the wait time $T_W - T_a$ is zero or a positive time and also the advance angle $T_a$ is limited to $T_a \geq 0$.

As mentioned previously, the wait time $T_W - T_a$ is computed so that the ignition advance angle becomes $T_a$ with the leading edge position of the output signal $V_{out}$ of the periodic pulse detecting circuit 700 of one period before as a reference. The leading edge position of the output signal $V_{out}$ is subjected to zero-crossing detection by the periodic pulse detecting circuit 700 and usually it is selected to be a suitable reference position, e.g., the TDC (top dead center) or 10° BTDC (before top dead center). As a result, the ignition advance angle $T_a$ represents the advance angle from the above-mentioned reference position detected accurately by the zero crossing method.

Thus, the ignition system shown by the abovedescribed fifth embodiment has the following effects:

(1) It is possible to obtain a crankshaft position signal having the necessary dwell angle $T_W$ for ensuring the desired advance angle range.

(2) Due to the detection of a zero crossing at the TDC or a given reference position, the ignition position of an ignition pulse generated in accordance therewith is accurate. The advantages of the invention shown by the above-described embodiments may be summarized as follows.

1. Noise reduction is possible (particularly using the fourth embodiment)

Since the threshold voltage Vh is varied with a time constant and since this time constant can be selected for example from among those in the following table in accordance with the conditions, the margin of the threshold voltage can be increased at times other than the anticipated transition times of the comparator.

The relationship of the values in the table represents a case where the effective operating times of the time constant circuits are shifted such that a time constant $\tau_1$ is selected for a unit time 1 just after the transition of the comparator output to "1", a time constant $\tau_2$ is selected for the duration of the next unit time (up to an elapsed time 2) and then time constants $\tau_3$ and $\tau_4$ are selected and that upon transition of the comparator output to "0" the diode 303 in the embodiment of FIG. 8 is turned on thereby causing the threshold voltage to vary with a time constant $\tau_0$.

| Conditions | | Time constants of fourth embodiment |
|---|---|---|
| Comparator output | Elapsed time | |
| 1 | 0 | $\tau_1$ |
| 1 | 1 | $\tau_2$ |
| 1 | 2 | $\tau_3$ |
| 1 | 3 | $\tau_4$ |
| . | . | . |
| . | . | . |
| . | . | . |
| 0 | 0 | $\tau_0$ |
| 0 | 1 | $\tau_0$ |
| 0 | 2 | $\tau_0$ |
| 0 | 3 | $\tau_0$ |
| . | . | . |
| . | . | . |
| . | . | . |

2. The dwell angle characteristic corresponding to frequencies can be programmed (the fourth and fifth embodiments).

Since the time constant can be changed with respect to the input frequency in accordance with the circuit conditions as mentioned previously, the threshold margine can be increased at times other than the desired dwell angle and at the time of the desired dwell angle the margin is changed to zero thereby changing the state of the comparator.

3. The threshold voltage proportional to the engine speed can be generated (the fourth and fifth embodiments).

Since the time constant of the threshold voltage can be changed in accordance with the circuit conditions as mentioned previously, the threshold voltage Vh can be made approximately proportional to the input frequency f.

4. Simplified construction Reduced cost (the first to fifth embodiments)

The time constant of the threshold voltage can be changed in accordance with the circuit conditions by means of the following elements:

| Conditions | Element |
|---|---|
| Comparator output | diode |
| Elapsed time | resistors & capacitors |

The present invention is not intended to be limited to only the above-described embodiments and various changes and modifications can be made thereto within the scope and spirit of the invention stated in the appended claims. For example, a transistor may be used in place of a diode as an element which is turned on and off in accordance with the comparator output.

We claim:

1. A periodic signal detecting circuit comprising:
   a comparator circuit for comparing an input periodic signal and a threshold voltage and generating an output changing from one state to another state when said signal exceeds said threshold voltage and changing from said another state to said one state when said signal decreases below said threshold voltage; and
   a threshold voltage generating circuit responsive to said comparator circuit output to generate said threshold voltage, said threshold voltage generating circuit including time constant setting means for varying said threshold voltage with a predetermined time constant and means responsive to said change of state of said comparator circuit output to vary said time constant.

2. A circuit according to claim 1, wherein said threshold voltage generating circuit comprises a feedback resistor connected between an output terminal and a comparison input terminal of said comparator circuit, first time constant setting means including capacitor means connected to said feedback resistor, switch means characterized by turning on or off in response to said comparator circuit output, and second time constant setting means connected to said capacitor means through said switch means.

3. A circuit according to claim 2, wherein said first time constant setting means includes a unidirectional circuit connected in series with said capacitor means, wherein said unidirectional circuit conducts current in one direction only, and wherein means is provided to reduce said threshold voltage substantially to zero when said switch means is turned on.

4. A circuit according to claim 3, further comprising an electromagnetic pickup coil for generating a periodic signal waveform, signal lines for connecting the ends of said pickup coil to the input terminals of said comparator circuit, means connected to said signal lines for clamping said periodic signal waveform substantially to one polarity, and means for compensating said threshold voltage for zero-crossing detection of said periodic signal waveform.

5. A circuit according to claim 1, wherein said time constant setting means includes a plurality of time constant setting means for successively changing said time constant to vary said threshold voltage.

* * * * *